(12) United States Patent
Xie et al.

(10) Patent No.: US 12,685,135 B2
(45) Date of Patent: Jul. 14, 2026

(54) LOCAL INTERCONNECT FORMATION AT DOUBLE DIFFUSION BREAK

(71) Applicant: INTERNATIONAL BUSINESS MACHINES CORPORATION, Armonk, NY (US)

(72) Inventors: Ruilong Xie, Niskayuna, NY (US); Min Gyu Sung, Latham, NY (US); Julien Frougier, Albany, NY (US); Chanro Park, Clifton Park, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 18/060,003

(22) Filed: Nov. 30, 2022

(65) Prior Publication Data

US 2024/0178136 A1    May 30, 2024

(51) Int. Cl.
| | |
|---|---|
| *H10W 20/43* | (2026.01) |
| *H10D 30/01* | (2025.01) |
| *H10D 30/43* | (2025.01) |
| *H10D 30/67* | (2025.01) |
| *H10D 84/01* | (2026.01) |

(52) U.S. Cl.
CPC .......... *H10W 20/43* (2026.01); *H10D 30/014* (2025.01); *H10D 30/43* (2025.01); *H10D 30/6735* (2025.01); *H10D 84/0186* (2025.01)

(58) Field of Classification Search
CPC .. H10D 30/43; H10D 30/6735; H10D 30/014; H10D 84/0186; H10D 84/83; H01L 23/528; H10W 20/43
See application file for complete search history.

(56) References Cited

U.S. PATENT DOCUMENTS

| | | | |
|---|---|---|---|
| 3,962,052 | A | 6/1976 | Abbas |
| 5,811,868 | A | 9/1998 | Bertin |
| 5,814,889 | A | 9/1998 | Gaul |
| 5,998,292 | A | 12/1999 | Black |
| 6,198,168 | B1 | 3/2001 | Geusic |
| 7,276,787 | B2 | 10/2007 | Edelstein |
| 7,935,571 | B2 | 5/2011 | Ramiah |
| 8,276,002 | B2 | 9/2012 | Dennard |
| 8,344,512 | B2 | 1/2013 | Knickerbocker |
| 8,445,918 | B2 | 5/2013 | Bartley |
| 10,388,519 | B2 | 8/2019 | Smith |
| 10,586,765 | B2 | 3/2020 | Smith |
| 10,636,739 | B2 | 4/2020 | Beyne |
| 10,734,224 | B2 | 8/2020 | Smith |
| 10,797,139 | B2 | 10/2020 | Morrow |

(Continued)

*Primary Examiner* — Changhyun Yi
(74) *Attorney, Agent, or Firm* — Samuel A. Waldbaum

(57) ABSTRACT

A microelectronic structure including a first nano device that includes a plurality of first transistors and a second nano device that includes a plurality of second transistors. The first nano device and the second nano device are parallel to each other. A double diffusion break that extends across the first nano device and the second nano device. A back-end-of-the-line (BEOL) layer located on a frontside of the first nano device and the second nano device. A backside interconnect located on a backside of the first nano device and the second nano device and the BEOL layer is connected to the backside interconnect through the double diffusion break.

20 Claims, 25 Drawing Sheets

CROSS- SECTION X

(56)  References Cited

U.S. PATENT DOCUMENTS

| | | | |
|---|---|---|---|
| 10,833,089 B2 | 11/2020 | Pille | |
| 10,985,064 B2 | 4/2021 | Zhang | |
| 11,056,487 B2 | 7/2021 | Yang | |
| 2018/0145030 A1 | 5/2018 | Beyne | |
| 2018/0218973 A1 | 8/2018 | Nelson | |
| 2019/0164882 A1 | 5/2019 | Chen | |
| 2020/0105671 A1 | 4/2020 | Lai | |
| 2020/0266169 A1 | 8/2020 | Kang | |
| 2020/0373242 A1 | 11/2020 | Hiblot | |
| 2021/0104435 A1 | 4/2021 | Son | |
| 2021/0111115 A1 | 4/2021 | Patrick | |
| 2021/0118798 A1 | 4/2021 | Liebmann | |
| 2021/0134721 A1 | 5/2021 | Chiang | |
| 2021/0202385 A1 | 7/2021 | Huang | |
| 2021/0202472 A1 | 7/2021 | Thomson | |
| 2021/0296234 A1 | 9/2021 | Dechene | |
| 2022/0068815 A1 | 3/2022 | Vadi | |
| 2022/0102266 A1 | 3/2022 | Lim | |
| 2022/0301878 A1 | 9/2022 | Ruilong | |
| 2023/0087690 A1 | 3/2023 | Frougier | |
| 2023/0093101 A1 | 3/2023 | Xie | |
| 2023/0113296 A1 | 4/2023 | Farooq | |
| 2023/0128985 A1 | 4/2023 | Brent | |
| 2023/0378138 A1* | 11/2023 | Smith | H10D 30/6757 |
| 2023/0378156 A1* | 11/2023 | You | G06F 30/31 |

* cited by examiner

TOP DOWN VIEW

CROSS- SECTION Y

108

105

CROSS- SECTION X 116
114
110

106

108

105

CROSS- SECTION Y

CROSS- SECTION X

TOP DOWN VIEW

CROSS- SECTION Y

CROSS- SECTION X

CROSS- SECTION Y

115

105

CROSS- SECTION X 116
114
110

106

122

130

125

118

108

105

CROSS- SECTION Y

CROSS- SECTION X

TOP DOWN VIEW

CROSS- SECTION X

CROSS- SECTION Y

CROSS- SECTION X

CROSS- SECTION Y

CROSS- SECTION X

CROSS- SECTION Y

TOP DOWN VIEW

DOUBLE
DIFFUSION
BREAK

194

GATE CUT

CROSS- SECTION X

CROSS- SECTION Y

CROSS- SECTION X

CROSS- SECTION Y

CROSS- SECTION X

CROSS- SECTION Y

CROSS- SECTION X

CROSS- SECTION Y

CROSS- SECTION X

CROSS- SECTION Y

LOCAL INTERCONNECT FORMATION AT DOUBLE DIFFUSION BREAK

BACKGROUND

The present invention generally relates to the field of microelectronics, and more particularly to formation of an interconnected formed within a double diffusion break.

Nanosheet is the lead device architecture in continuing CMOS scaling. However, nanosheet technology has shown issues when scaling down such that as the devices become smaller and closer together, they are interfering with each other. With the number of devices being fit in a smaller area it is becoming harder to form the necessary contact and to form the necessary breaks to separate the devices from each other.

BRIEF SUMMARY

Additional aspects and/or advantages will be set forth in part in the description which follows and, in part, will be apparent from the description, or may be learned by practice of the invention.

A microelectronic structure including a first nano device that includes a plurality of first transistors and a second nano device that includes a plurality of second transistors. The first nano device and the second nano device are parallel to each other. A double diffusion break that extends across the first nano device and the second nano device. A back-end-of-the-line (BEOL) layer located on a frontside of the first nano device and the second nano device. A backside interconnect located on a backside of the first nano device and the second nano device and the BEOL layer is connected to the backside interconnect through the double diffusion break.

A microelectronic structure including a first nano device that includes a plurality of first transistors and a second nano device that includes a plurality of second transistors. The first nano device and the second nano device are parallel to each other. A double diffusion break that extends across the first nano device and the second nano device. The first nano device includes a first dummy device, and the second nano device includes a second dummy device. A back-end-of-the-line (BEOL) layer located on a frontside of the first nano device and the second nano device. A backside interconnect located on a backside of the first nano device and the second nano device. The BEOL layer is connected to the backside interconnect through the double diffusion break.

A microelectronic structure including a first nano device that includes a plurality of first transistors and a second nano device that includes a plurality of second transistors. The first nano device and the second nano device are parallel to each other. A double diffusion break that extends across the first nano device and the second nano device. A back-end-of-the-line (BEOL) layer located on a frontside of the first nano device and the second nano device. A backside interconnect located on a backside of the first nano device and the second nano device. An interconnect contact that extends from the BEOL layer to the double diffusion break. The interconnect contact extends from the first nano device to the second nano device and the BEOL layer is connected to the backside interconnect through the double diffusion break.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
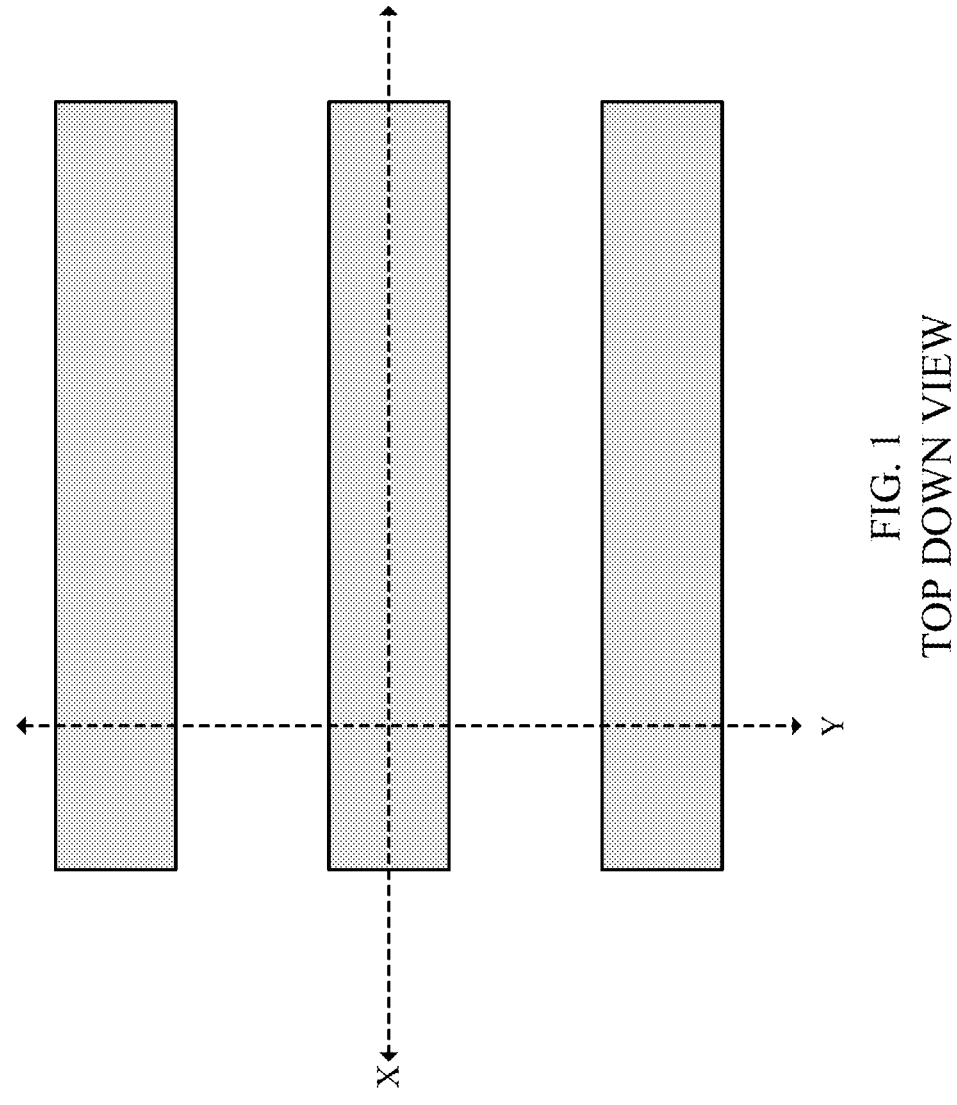
FIG. 1 illustrates a top-down view of multiple nano devices, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of +8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed to forming a double diffusion break that separates devices and to form an interconnected within the double diffusion break. The double diffusion break extends perpendicularly across two parallel devices. A conductive metal pad is located within the double diffusion break such that the metal pad provides a connection between the frontside and the backside of the device.

FIG. 1 illustrates a top-down view of multiple devices, in accordance with the embodiment of the present invention. The cross-section X extends horizontally through the nano stacks of one of the devices. Cross section Y is perpendicular to cross section X, where cross section Y is through a source/drain region that spans across multiple nano stacks.

Figures 2, 3:
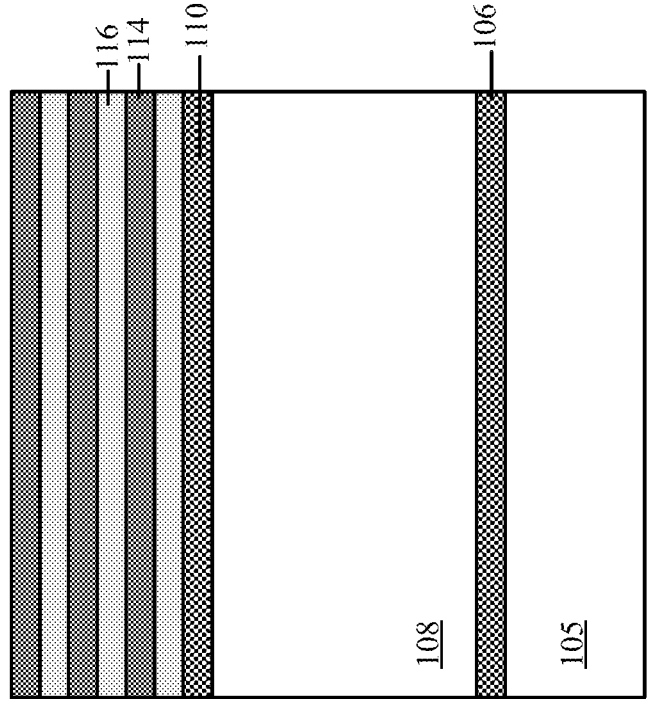
FIG. 2 illustrates a cross section X of the nano stack after the formation of the alternating layers, in accordance with the embodiment of the present invention.
FIG. 3 illustrates a cross section Y of the source/drain region after the patterning to form the nano columns, in accordance with the embodiment of the present invention.

FIGS. 2, and 3 illustrate the processing stage after the patterning of the alternating layers to form the nano columns. The nano device includes a first substrate 105, an etch stop 106, a second substrate 108, a first layer 110, and alternating layers comprised of sacrificial layers 116 and channel layers 114.

The first substrate 105 and the second substrate 108 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the first substrate 105 and the second substrate 108. In some embodiments, the first substrate 105 and the second substrate 108 includes both semiconductor materials and dielectric materials. The semiconductor first substrate 105 and the second substrate 108 may also comprise an organic semiconductor or a layered semiconductor such as, for example, Si/SiGe, a silicon-on-insulator or a SiGe-on-insulator. A portion or the entire semiconductor first substrate 105 and the second substrate 108 may also be comprised of an amorphous, polycrystalline, or monocrystalline. The semiconductor first substrate 105 and the second substrate 108 may be doped, undoped or contain doped regions and undoped regions therein.

The first layer 110 can be comprised of SiGe, where Ge is in the range of about 45% to 70%. The alternating layers includes the sacrificial layers 116 and the channel layers 114. The sacrificial layers 116 can be comprised of SiGe, where Ge is in the range of about 15% to 35%. The channel layers 114 can be comprised of, for example, Si. The difference in the concentration of Ge between the first layer 110 and the sacrificial layers 116 allows for the selective targeting of the first layer 110. The present invention illustrates that the alternating layers is comprised of the first layer 110, three nanosheets (i.e., the channel layers 114), and three sacrificial layers 116, but this is not meant to be seen as limiting. The number layers that comprise the alternating layers can be more or less than what is illustrated in the figures. As illustrated by FIG. 2 the alternating layers are separated into a plurality of nano columns. The second substrate 108 is etched during the patterning of the alternating layers.

Figure 5:
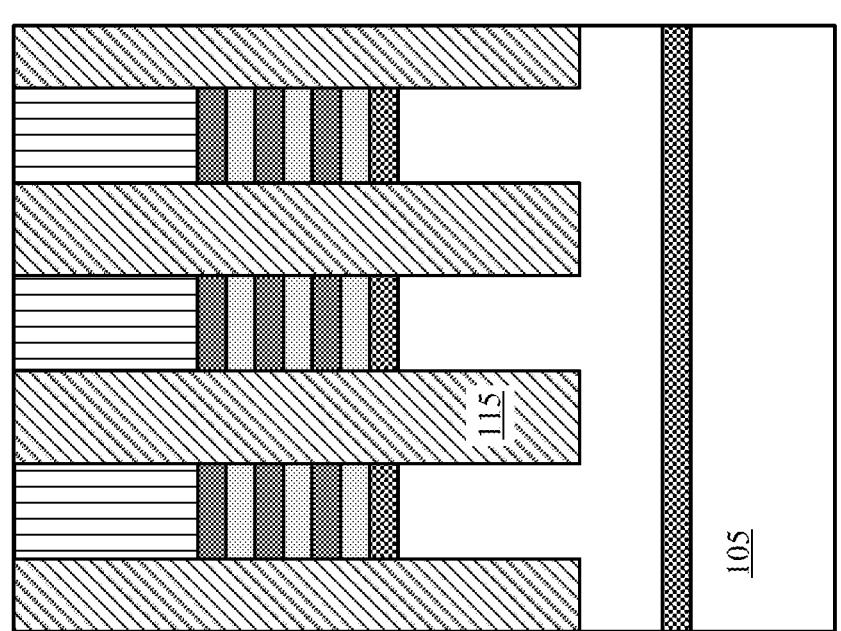
FIG. 5 illustrates a cross section Y of the source/drain region after the formation of a hardmask and a first interlayer dielectric layer, in accordance with the embodiment of the present invention.
Figure 4:
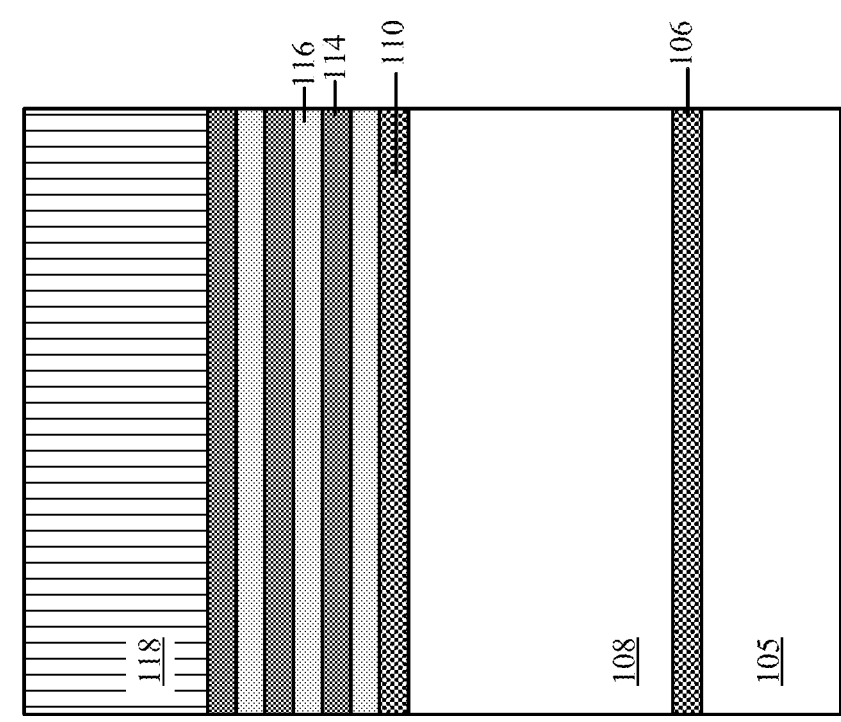
FIG. 4 illustrates a cross section X of the nano stack after the formation of a hardmask and a first interlayer dielectric layer, in accordance with the embodiment of the present invention.

FIGS. 4, and 5 illustrate the processing stage after the formation of a first interlayer dielectric layer 115. A first interlayer dielectric layer 115 is formed in the cavities in the second substrate 108 and in the space between the nano columns as illustrated by FIG. 5 by dielectric deposition and CMP.

Figure 6:
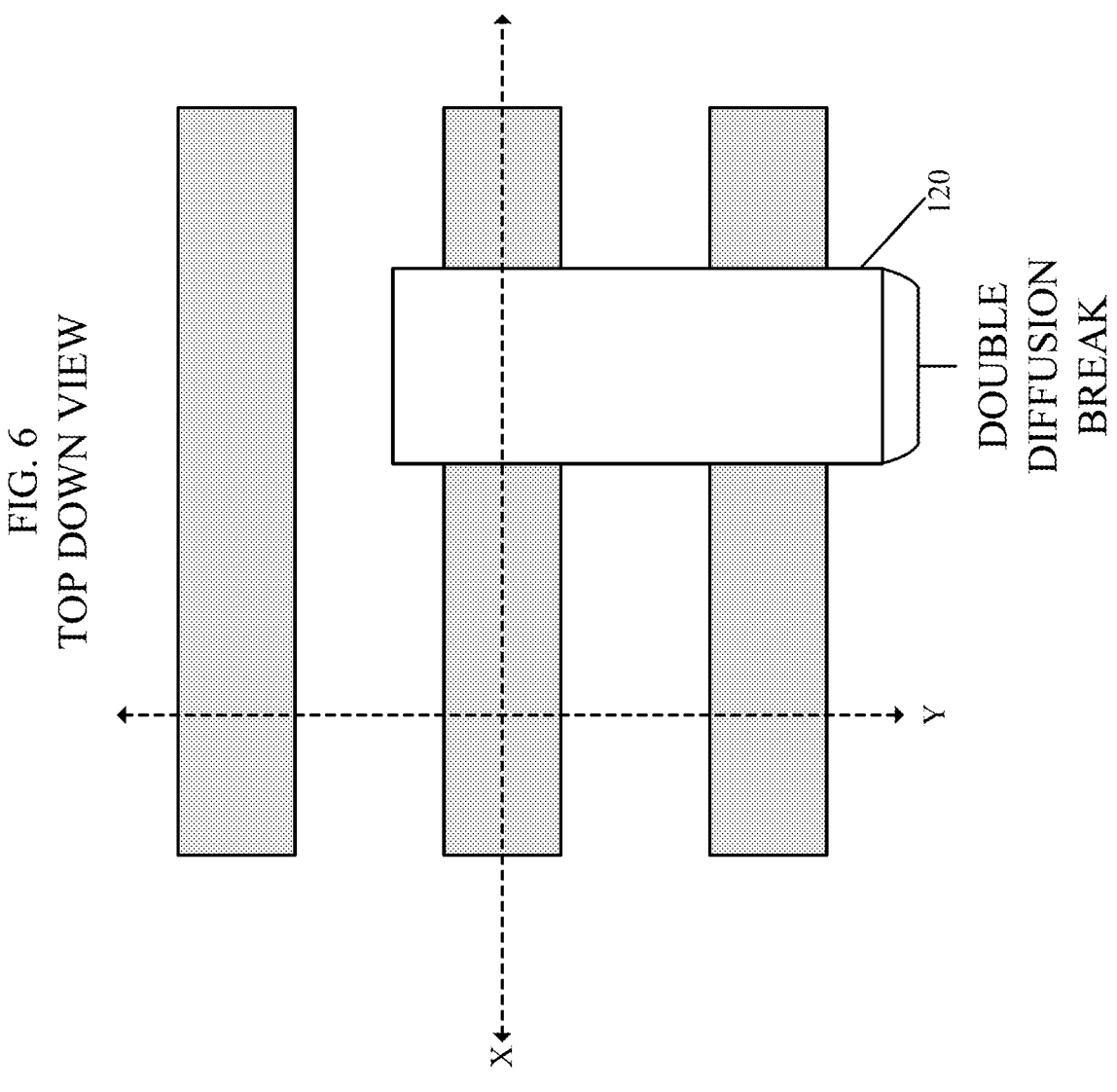
FIG. 6 illustrates a top-down view of multiple nano devices after the formation of the double diffusion break cavity, in accordance with the embodiment of the present invention.
Figure 8:
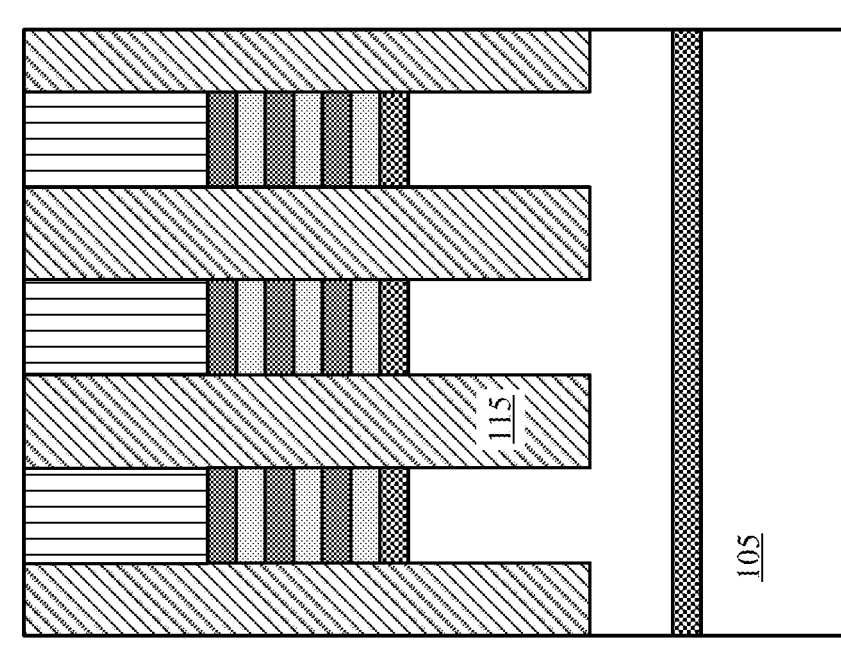
FIG. 8 illustrates a cross section Y of the source/drain region after the formation of the double diffusion break cavity, in accordance with the embodiment of the present invention.
Figure 7:
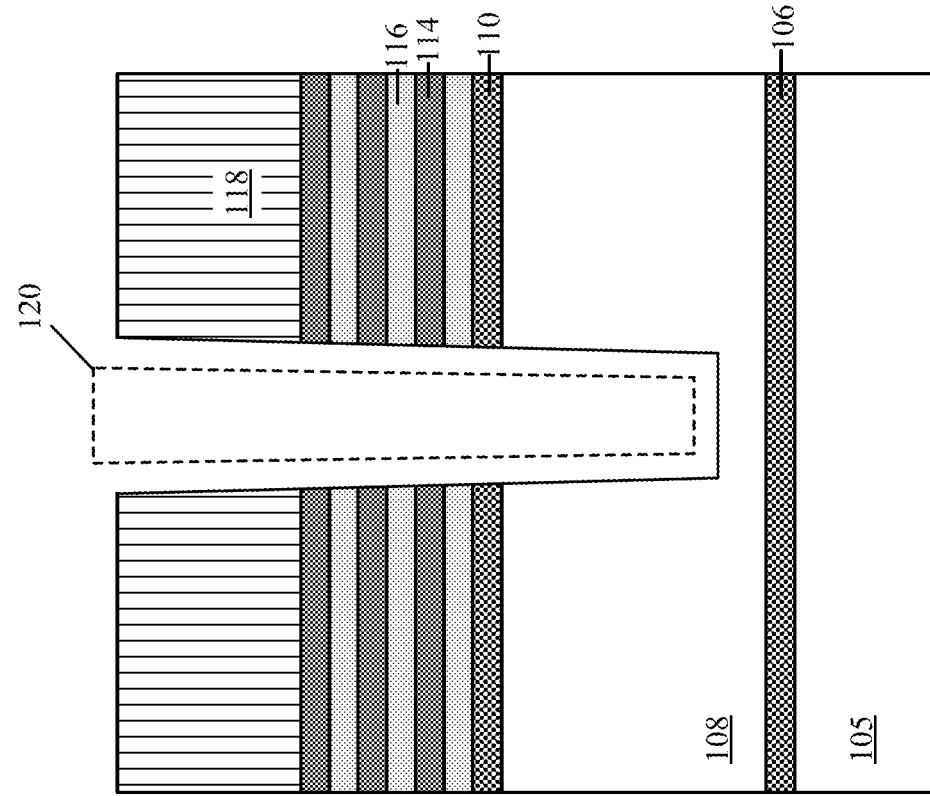
FIG. 7 illustrates a cross section X of the nano stack after the formation of the double diffusion break cavity, in accordance with the embodiment of the present invention.

FIGS. 6, 7, and 8 illustrate the processing stage after the formation of the double diffusion break cavity 120. A double diffusion break cavity 120 is formed by removing sections of the alternating layers and a portion of the second substrate 108. The double diffusion break cavity 120 has an orientation/alignment that extends across at least two nano columns as illustrated by FIG. 6. FIG. 7 illustrates that the double diffusion break cavity 120 extends through the hardmask 118, the alternating layers, the first layer 110, and into the second substrate 108.

Figures 9, 10:
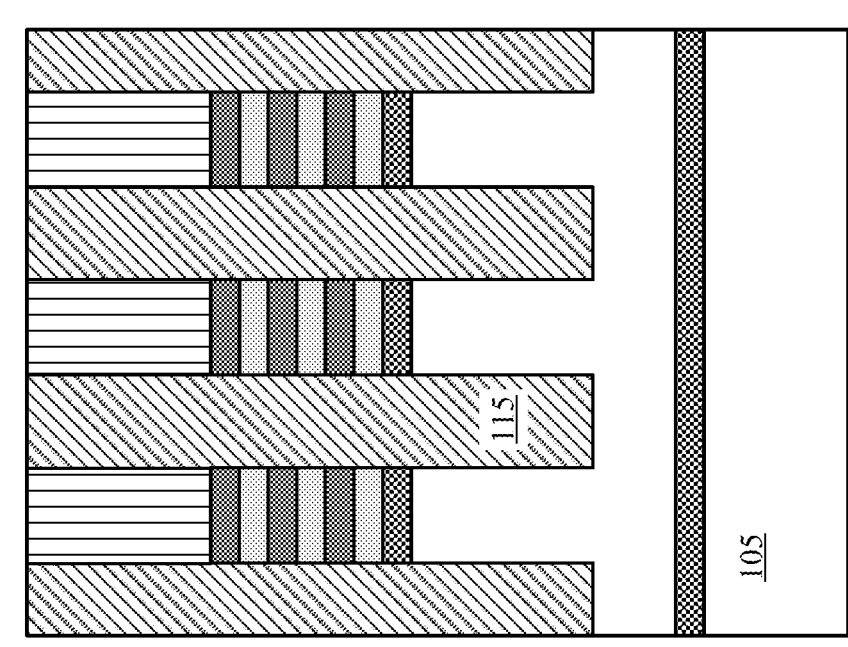
FIG. 9 illustrates a cross section X of the nano stack after the formation of a dielectric liner and a metal fill layer, in accordance with the embodiment of the present invention.
FIG. 10 illustrates a cross section Y of the source/drain region after the formation of a dielectric liner and a metal fill layer, in accordance with the embodiment of the present invention.

FIGS. 9, and 10 illustrate the processing stage after the formation of a dielectric liner 125 and a metal fill layer 130. A dielectric liner 125 is formed on the sidewalls and the bottom wall of the double diffusion break cavity 120. A metal fill layer 130 fills the space within the double diffusion break cavity 120 followed by metal/dielectric liner CMP, stopping on the hardmask 118. The metal fill layer 130 is then recessed back to remove excess material and to form cavity 122 within the double diffusion break.

Figures 11, 12:
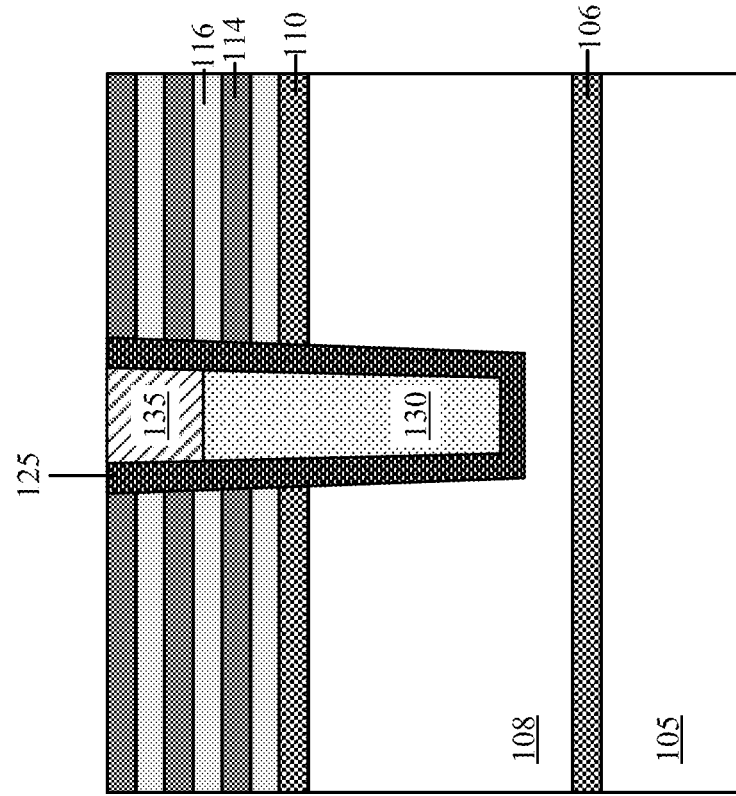
FIG. 11 illustrates a cross section X of the nano stack after the formation of an interlayer dielectric cap and etching of the first interlayer dielectric, in accordance with the embodiment of the present invention.
FIG. 12 illustrates a cross section Y of the source/drain region after the formation of an interlayer dielectric cap and etching of the first interlayer dielectric, in accordance with the embodiment of the present invention.

FIGS. 11, and 12 illustrate the processing stage after the formation of an interlayer dielectric cap 135 and etching of the first interlayer dielectric layer 115. The cavity 122 is filled in with a second interlayer dielectric material to form the interlayer dielectric cap 135. The interlayer dielectric cap 135 is comprised of a dielectric material that is different from the dielectric material that comprises the first interlayer dielectric layer 115. The first interlayer dielectric layer 115 is recessed to expose the sidewalls of the nano columns and the hardmask 118 is removed, as illustrated by FIG. 12. The dielectric liner 125 and the interlayer dielectric cap 135 are pulled down so that the top surface of these components is substantially at the same height as the top surface of the top layer of the alternating layers.

Figure 13:
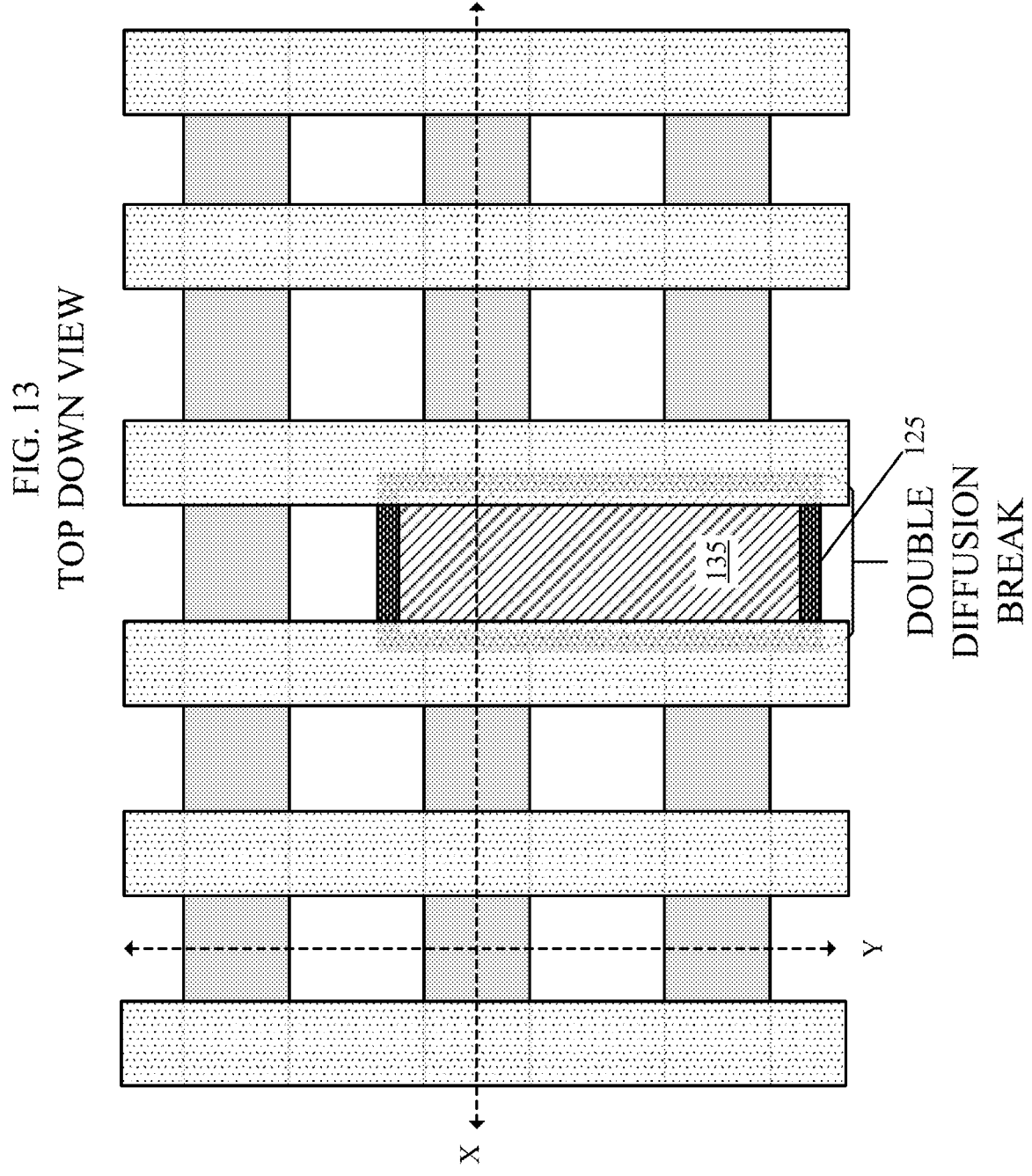
FIG. 13 illustrates a top-down view of multiple nano devices after the formation of dummy gate columns and the formation of the bottom dielectric layer, in accordance with the embodiment of the present invention.
Figure 14:
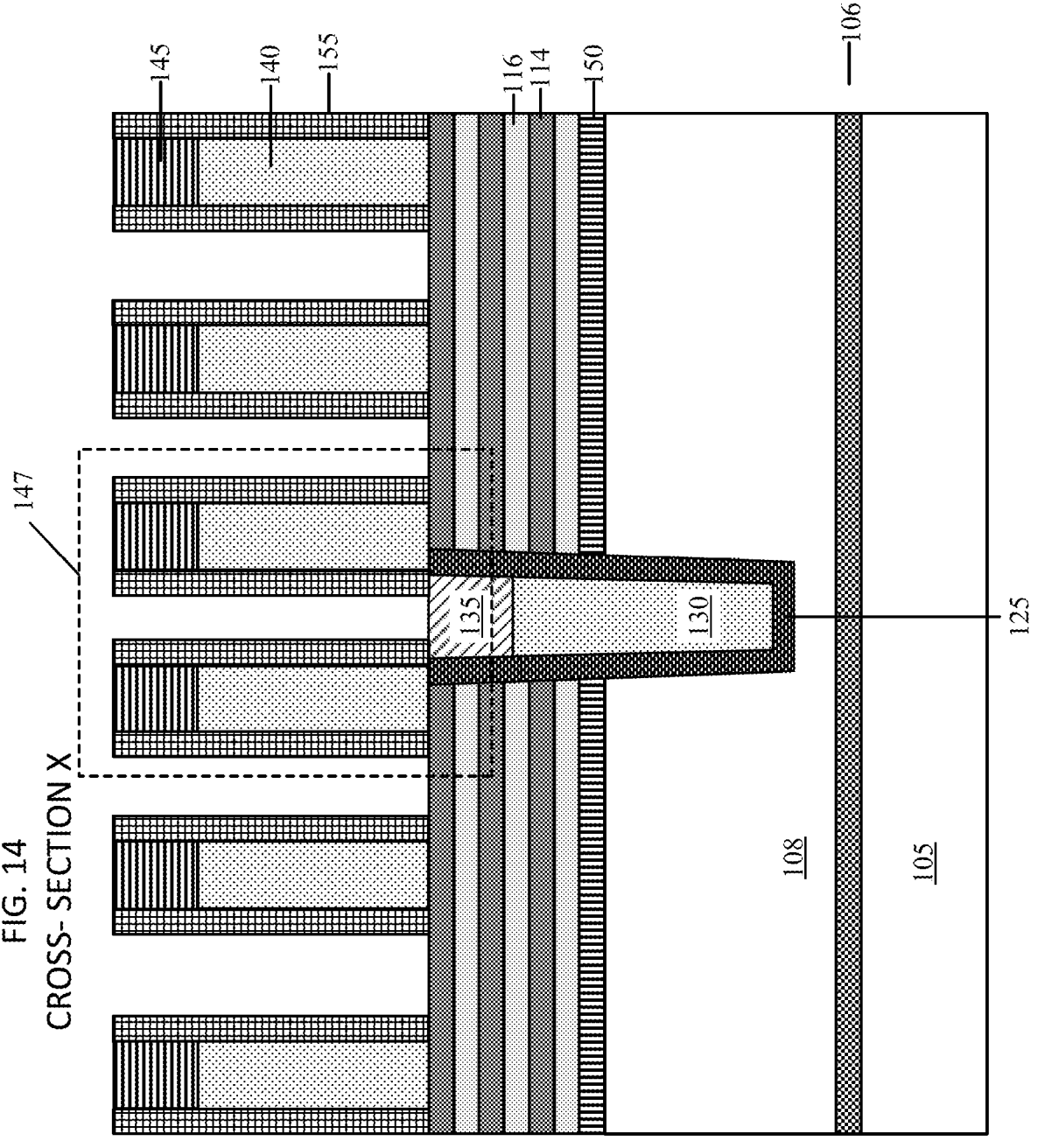
FIG. 14 illustrates a cross section X of the nano stack after the formation of dummy gate columns and the formation of the bottom dielectric layer, in accordance with the embodiment of the present invention.
Figure 15:
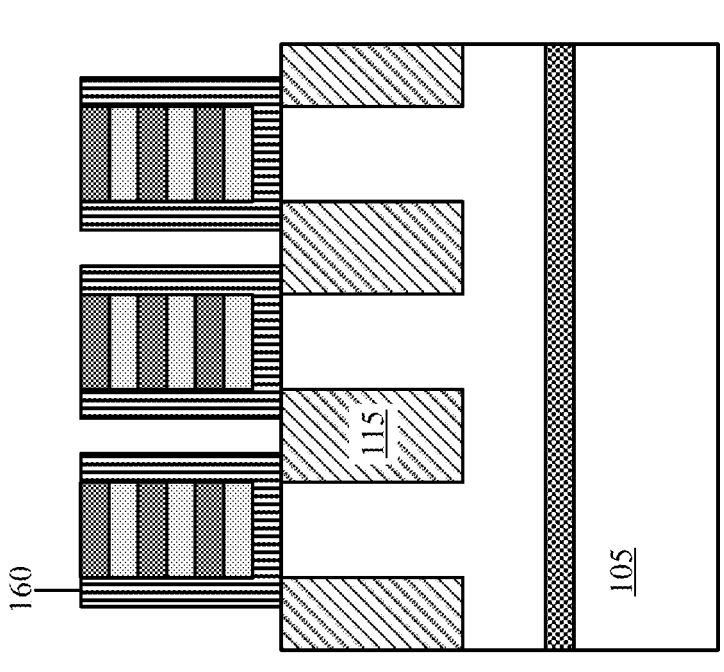
FIG. 15 illustrates a cross section Y of the source/drain region after the formation of dummy gate columns and the formation of the bottom dielectric layer, in accordance with the embodiment of the present invention.

FIGS. 13, 14 and 15 illustrate the processing stage after the formation of dummy gate columns and the formation of the bottom dielectric layer 150. The dummy gate 140 is formed on top of the top layer of the alternating layers and a second hardmask 145 is formed on top of the dummy gate 140. The dummy gate 140 and the second hardmask 145 are patterned to form a plurality of columns, where the dummy gate columns are perpendicular to the nano columns, as illustrated by FIG. 13. Dashed box 147, as illustrated in FIG. 14, emphasizes two of the dummy gate columns that overlap with the dielectric liner 125 and the interlayer dielectric cap 135. The first layer 110 is selectively removed and a bottom dielectric layer 150 is formed. The first layer 110 can be selectively targeted for removal because of the higher concentration of Ge when compared to the sacrificial layers 116. An upper spacer 155 is formed along the sidewalls of the dummy gate 140 and the second hardmask 145. As illustrated by FIG. 15, the bottom dielectric layer 150 and the upper spacer 155 form a U-shaped spacer 160 that is located beneath and along the sidewalls of the alternating layers.

Figure 16:
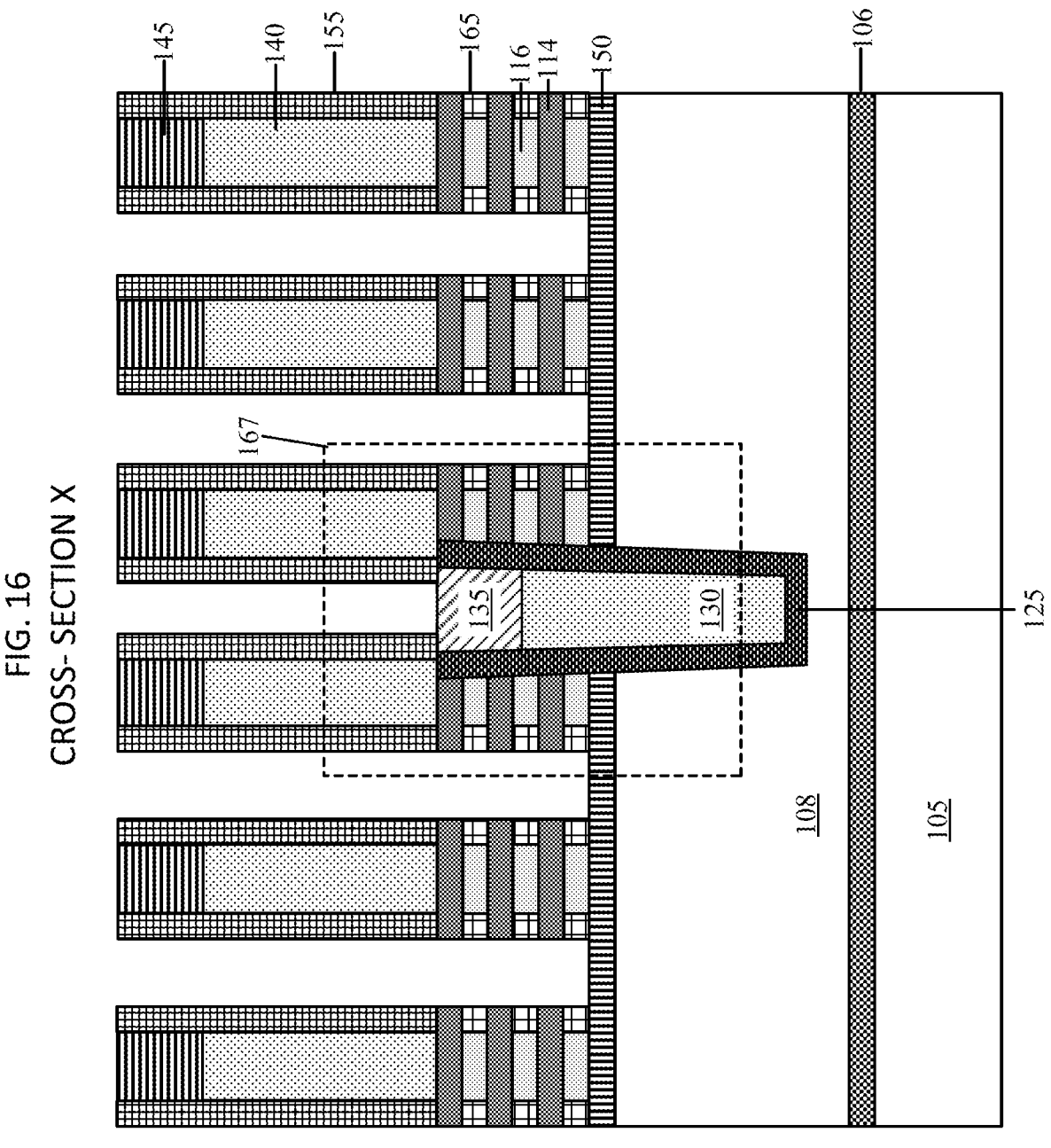
FIG. 16 illustrates a cross section X of the nano stack after patterning the alternating layers, recessing of the sacrificial layers, and the formation of an inner spacer, in accordance with the embodiment of the present invention.
Figure 17:
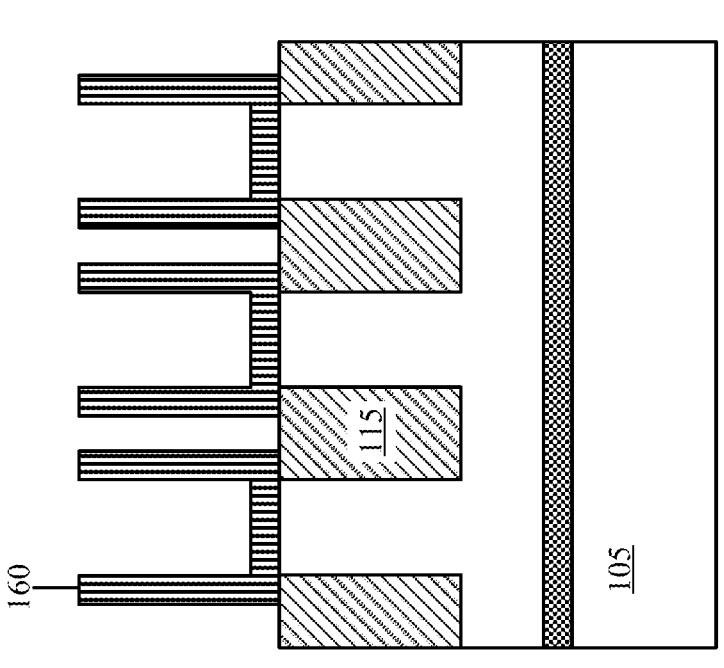
FIG. 17 illustrates a cross section Y of the source/drain region after patterning the alternating layers, recessing of the sacrificial layers, and the formation of an inner spacer, in accordance with the embodiment of the present invention.

FIGS. 16 and 17 illustrate the processing stage after patterning the alternating layers, recessing of the sacrificial layers 116, and the formation of an inner spacer 165. The alternating layers are etched to form the gate regions and the source/drain regions. FIG. 16 illustrates the gate regions and the source/drain regions, while FIG. 17 illustrates the source/drain region. The sacrificial layers 116 are recessed back to create a cavity (not shown) between the channel layers 114. The cavities are filled in to form the inner spacer 165. Dashed box 167 emphasizes the two gate regions adjacent to the double diffusion break, hereinafter referred to as the dummy devices 167, such that channel layers of the dummy devices 167 are flush against the dielectric liner 125. FIG. 17 illustrates that the patterning and recessing of the alternating layers causes empty space to become available in and around the U-shaped spacer 160.

Figure 18:
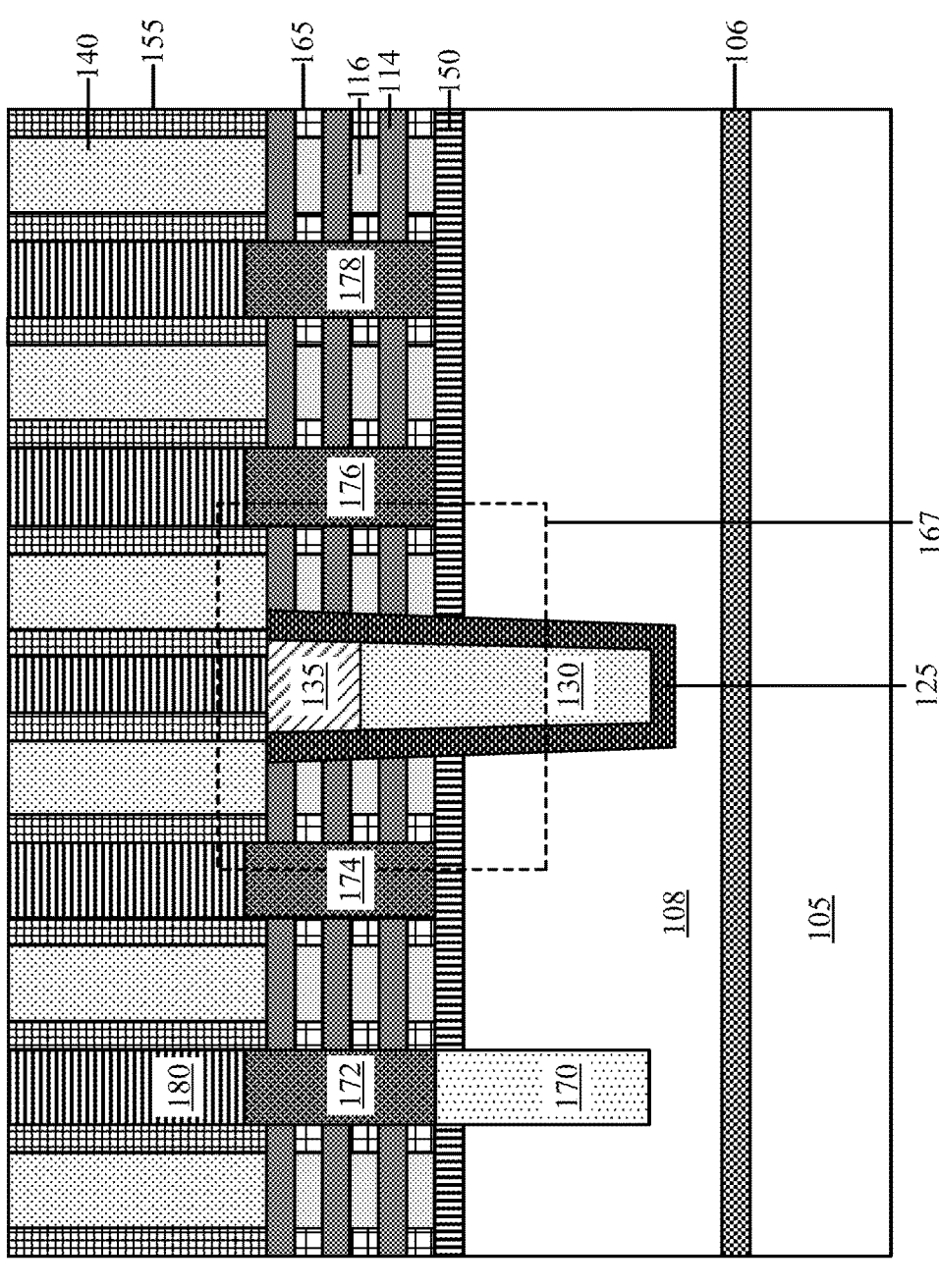
FIG. 18 illustrates a cross section X of the nano stack after formation of a backside placeholder, the formation of the source/drains, and the formation of a third interlayer dielectric layer, in accordance with the embodiment of the present invention.
Figure 19:
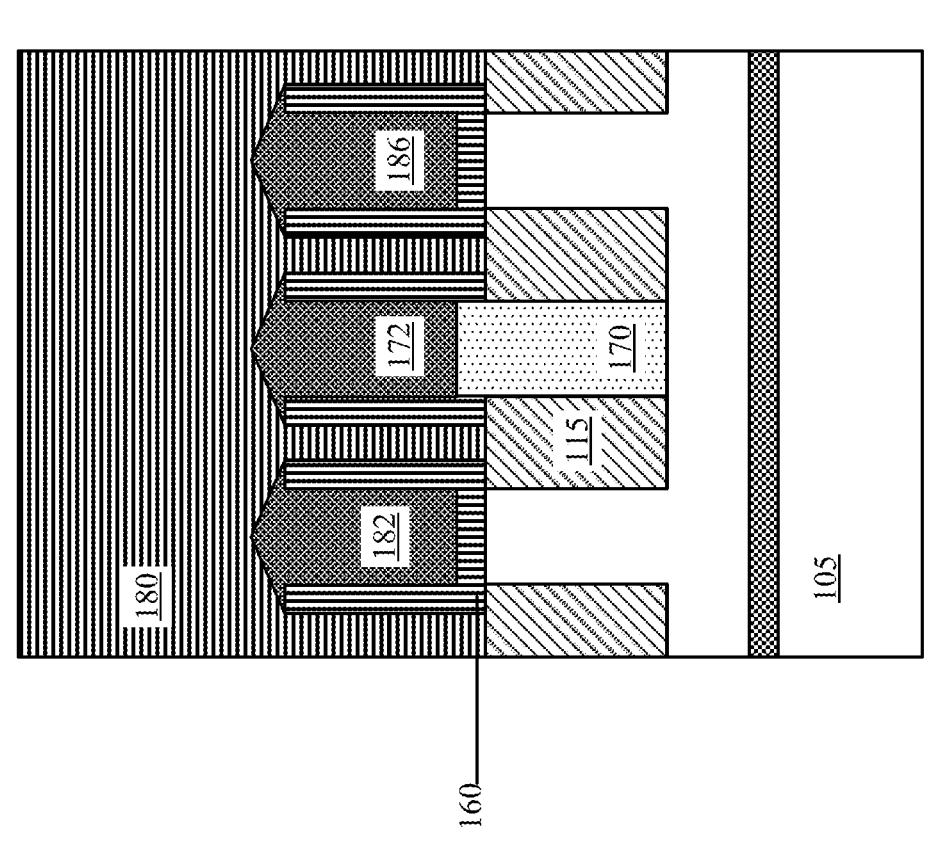
FIG. 19 illustrates a cross section Y of the source/drain region after formation of a backside placeholder, the formation of the source/drains, and the formation of a third interlayer dielectric layer, in accordance with the embodiment of the present invention.

FIGS. 18 and 19 illustrate the processing stage after formation of a backside placeholder 170, the formation of the source/drains 172, 174, 176, 178, 182, and 186, and the formation of a third interlayer dielectric layer 180. A portion of the bottom dielectric layer 150 is removed and a portion of the second substrate 108 is removed to form a cavity (not shown) in the second substrate 108. The cavity is filled in with a sacrificial material to form the backside placeholder 170. As illustrated in FIG. 19, a portion of the bottom section of the U-shaped spacer 160 is removed to expose the second substrate 108 during the formation of the cavity. The backside placeholder 170 is in contact with the second substrate 108 and a segment of the U-shaped spacer 160. The source/drains 172, 174, 176, 178, 182, and 186 are formed such that one of the source/drain 172, 174, 176, 178, 182, and 186 is located between each of the gate regions, respectively, as illustrated by FIG. 18. Source/drain 172 is formed on top of the backside placeholder 170, such that the backside surface of the source/drain 172 is in direct contact with a frontside surface of the backside placeholder 170. However, a source/drain is not formed between the dummy devices 167 because these devices are flush against the double diffusion break, which prevents the formation of a source/drain at this location. A third interlayer dielectric layer 180 is formed on top of the source/drain drains 172, 174, 176, 178, 182, and 186. The second hardmask 145 and excess material of the third interlayer dielectric layer 180 is removed.

The source/drain 172, 174, 176, 178, 182, and 186 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 20:
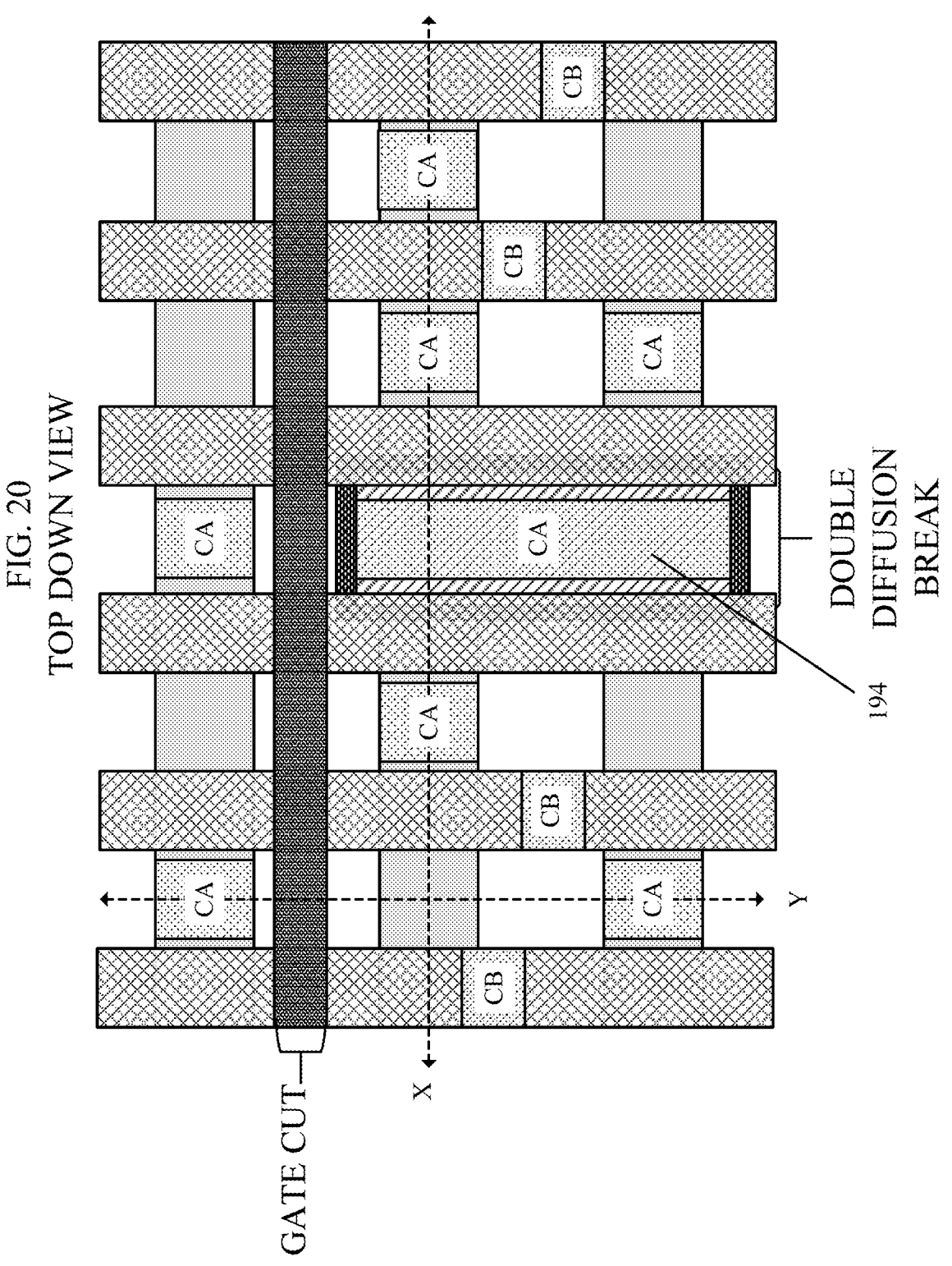
FIG. 20 illustrates a top-down view of multiple nano devices after formation of a gate cut, source/drain contacts, gate contacts, and the interconnect contact, in accordance with the embodiment of the present invention.
Figure 21:
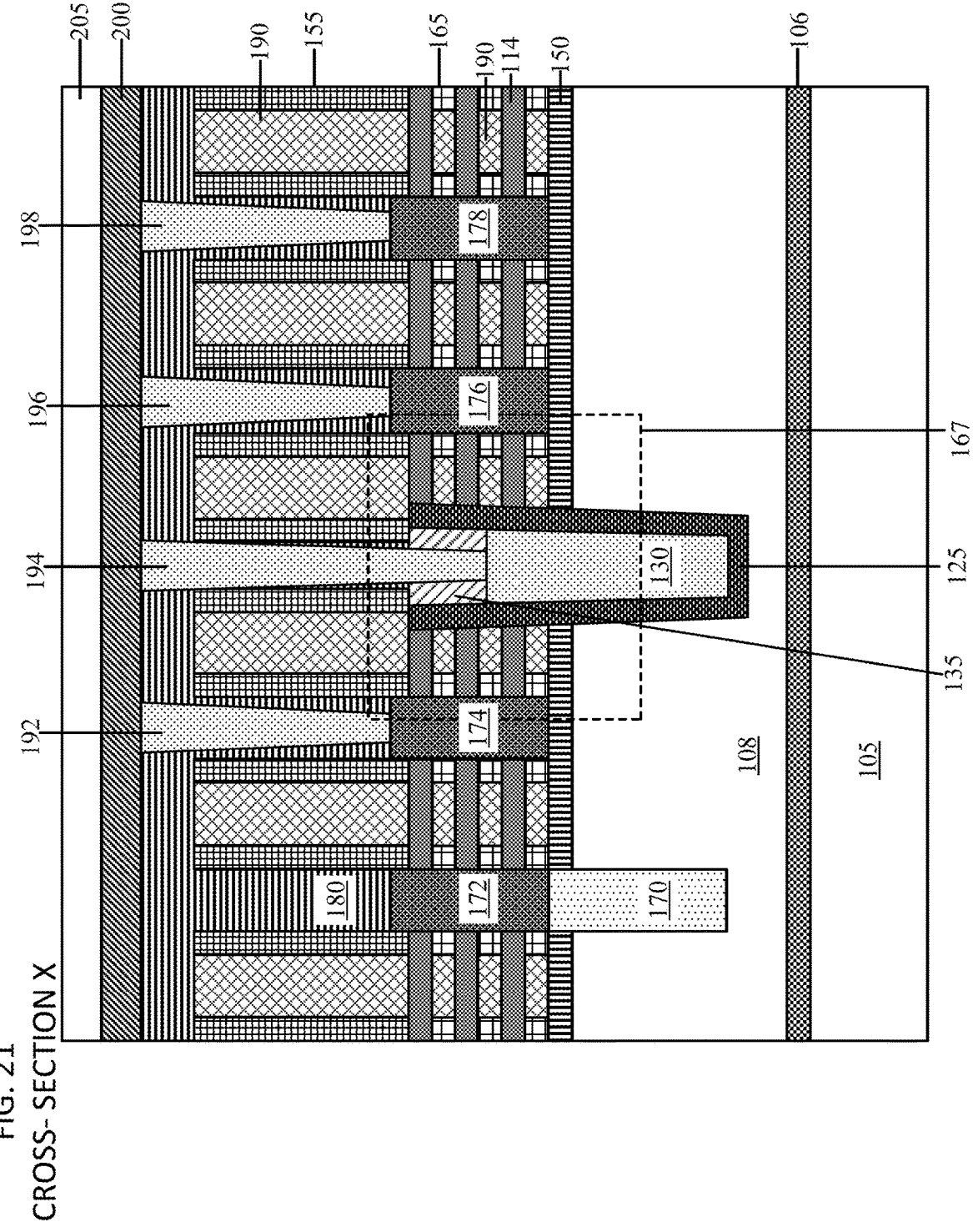
FIG. 21 illustrates a cross section X of the nano stack after formation of a gate cut, source/drain contacts, gate contacts, and the interconnect contact, in accordance with the embodiment of the present invention.
Figure 22:
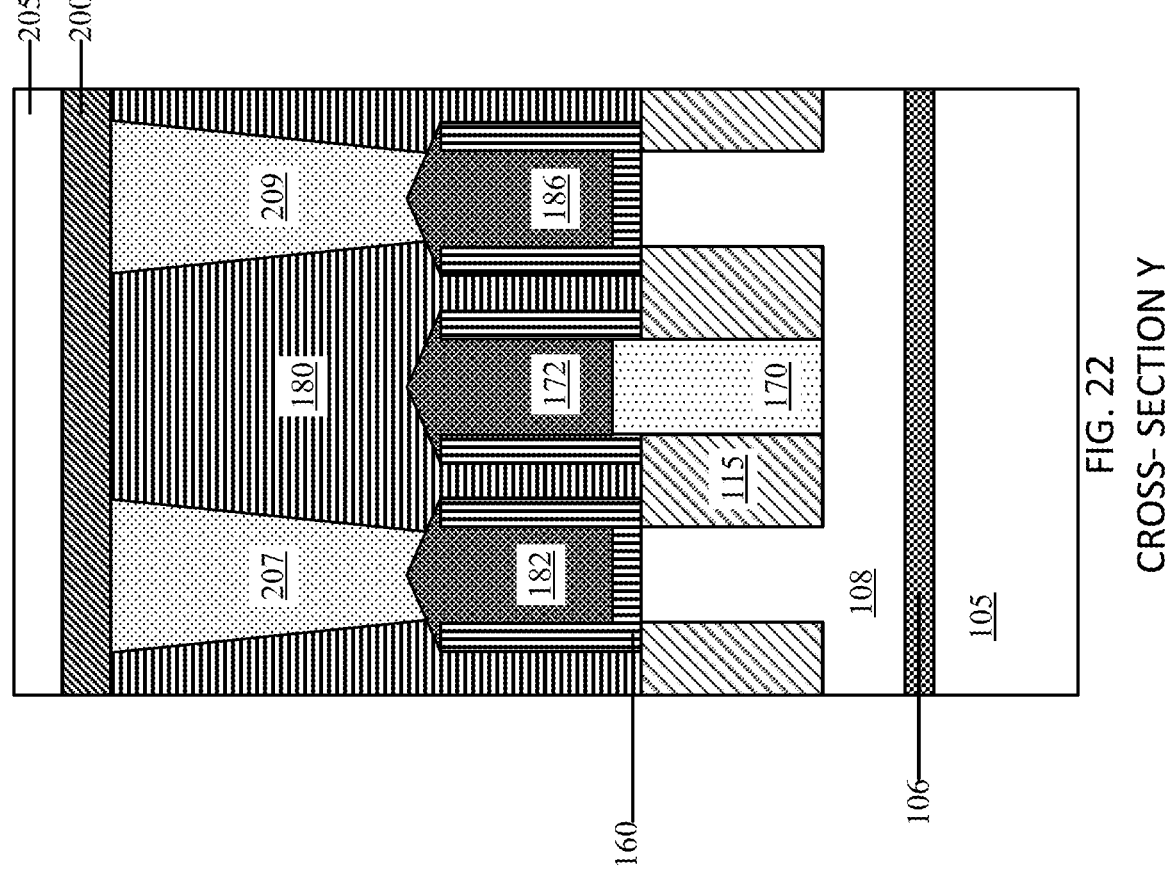
FIG. 22 illustrates a cross section Y of the source/drain region after formation of a gate cut, source/drain contacts, gate contacts, and the interconnect contact, in accordance with the embodiment of the present invention.

FIGS. 20, 21 and 22 illustrate the processing stage after formation of a gate cut, replacement gate 190, source/drain contacts 192, 196, 198, 207, and 209, gate contacts, and the interconnect contact 194. The sacrificial layers 116 and the dummy gate 140 are removed and the replacement gate 190 is formed in the available space caused by the removal of these layers. The gate 190 can be comprised of, for example, a gate dielectric liner, such as high-k dielectric like $HfO_2$, $ZrO_2$, $HfL_aO_x$, etc., and work function layers, such as TIN, TiAlC, TiC, etc., and conductive metal fills, like W.

FIG. 20 illustrates the formation of the gate cut and the gate contacts CB which are not shown in cross sections X and Y. Additional interlayer dielectric material is added to increase the height of the third interlayer dielectric layer 180, such that the third interlayer dielectric layer 180 extends along the top surface of the gate 190. A plurality of trenches/cavities (not shown) are formed in the third interlayer dielectric layer 180. These trenches/cavities are filled in with a conductive metal to form the source/drain contacts 192, 196, 198, 207, and 209. A trench (not shown) is formed in the third interlayer dielectric layer 180 and the interlayer dielectric cap 135 to expose a top surface of the metal fill layer 130. The trench (not shown) is filled with a conductive metal to form an interconnect contact 194. The interconnect contact 194 extends along the length of the double diffusion break as illustrated in FIG. 20, such that the interconnect contact 194 extends between the dummy device 167 of the first nano device to the dummy device of the second nano device (where the first nano device is parallel to the second nano device). A backend-of-the-line (BEOL) layer 200 is formed on top of the third interlayer dielectric layer 180, on top of the source/drain contacts 192, 196, 198, 207, and 209, gate contacts, and the interconnect contact 194. A carrier wafer 205 is formed on top of the BEOL layer 200. The carrier wafer 205 allows for the device to be flipped over and the backside processing of the device.

Figure 23:
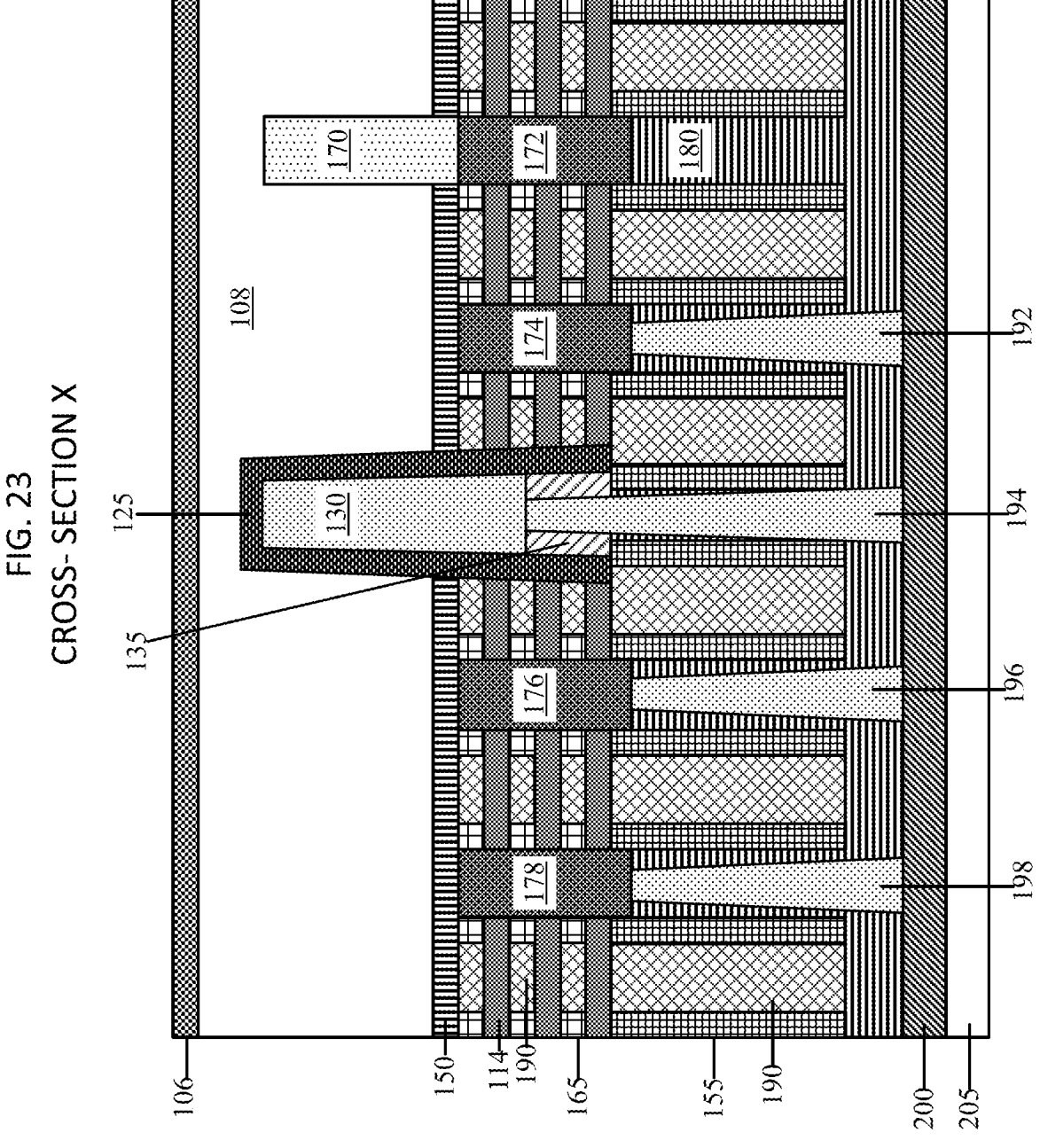
FIG. 23 illustrates a cross section X of the nano stack after flipping the device over and the removal of the first substrate, in accordance with the embodiment of the present invention.
Figure 24:
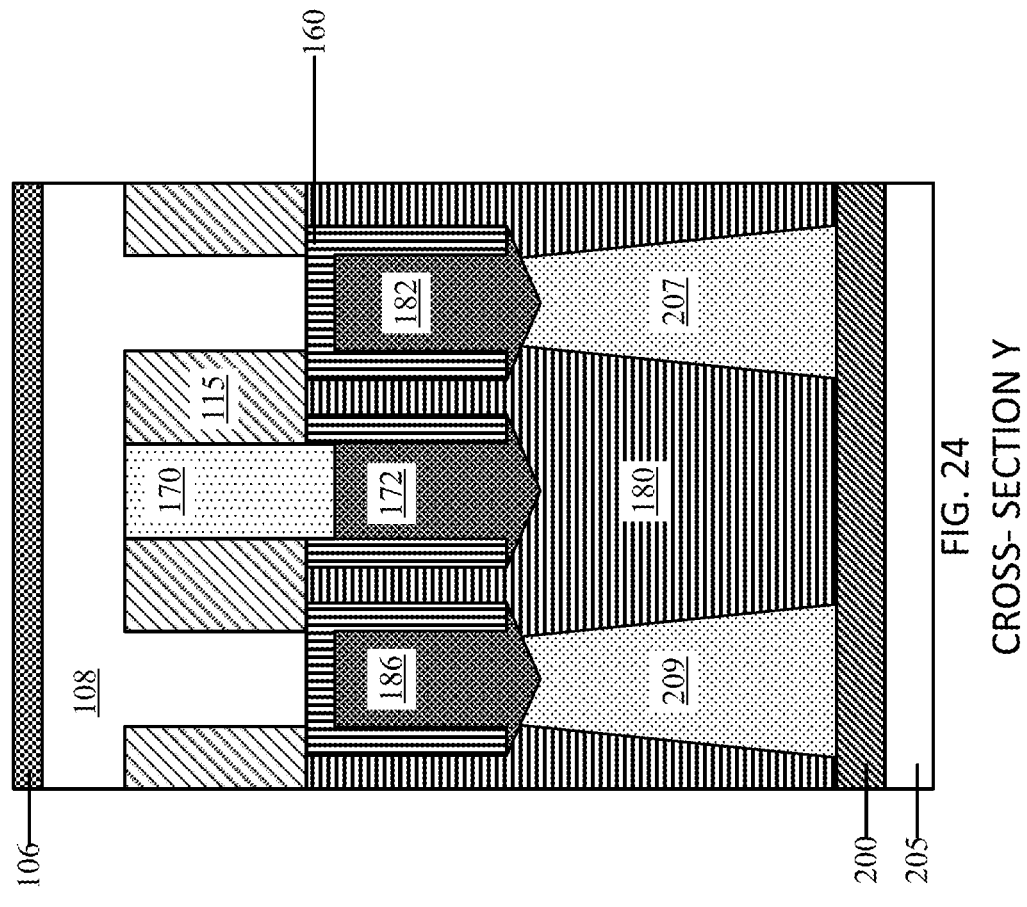
FIG. 24 illustrates a cross section Y of the source/drain region after flipping the device over and the removal of the first substrate, in accordance with the embodiment of the present invention.

FIGS. 23 and 24 illustrate the processing stage after flipping the device over and the removal of the first substrate 105. The device is flipped over for backside processing of the layers. The first substrate 105 is removed and a backside surface of the etch stop 106 is exposed.

Figure 25:
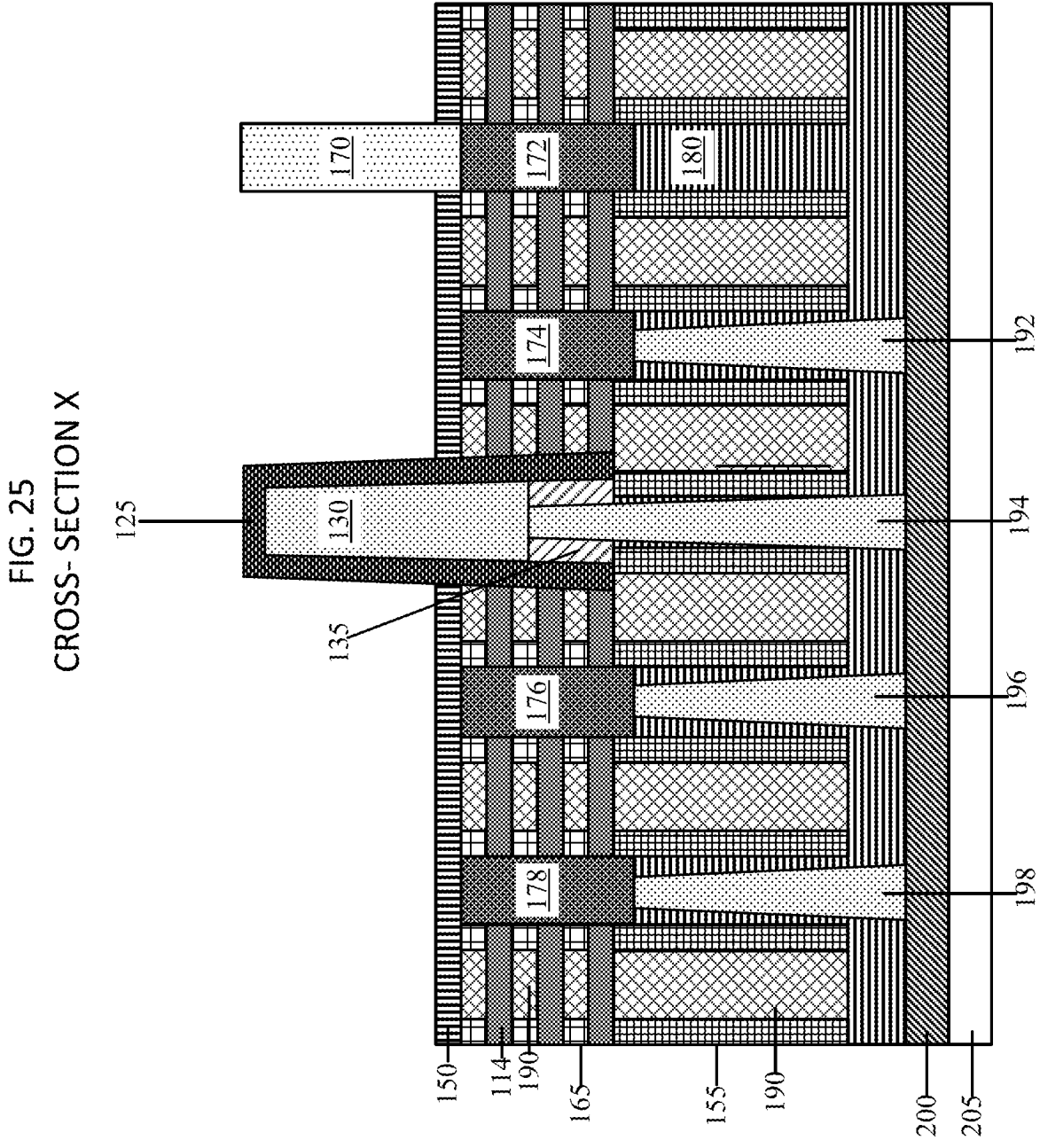
FIG. 25 illustrates a cross section X of the nano stack after removal of the etch stop and the second substrate, in accordance with the embodiment of the present invention.
Figure 26:
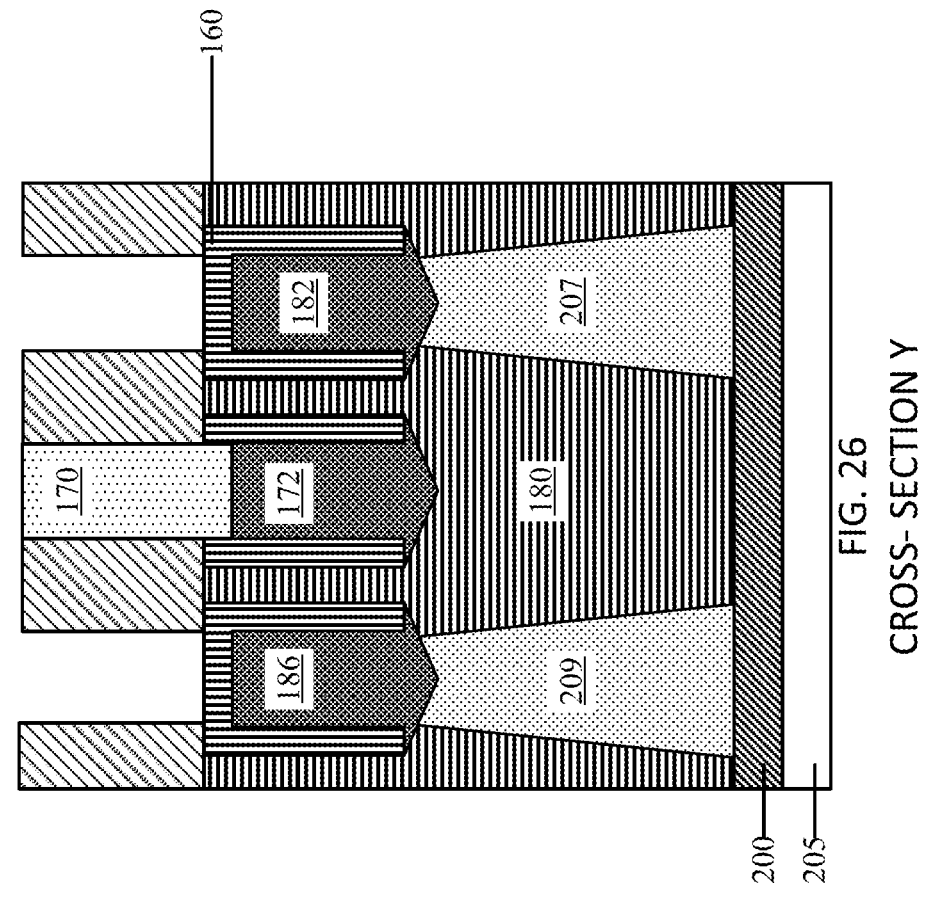
FIG. 26 illustrates a cross section Y of the source/drain region after removal of the etch stop and the second substrate, in accordance with the embodiment of the present invention.

FIGS. 25 and 26 illustrate the processing stage after removal of the etch stop 106 and the second substrate 108. The etch stop 106 and the second substrate 108 are removed. The removal of these layers exposes a backside surface of the bottom dielectric layer 150. A portion of the backside placeholder 170 is exposed and portions of the dielectric liner 125 of the double diffusion break is exposed by the removal of the second substrate 108.

Figure 27:
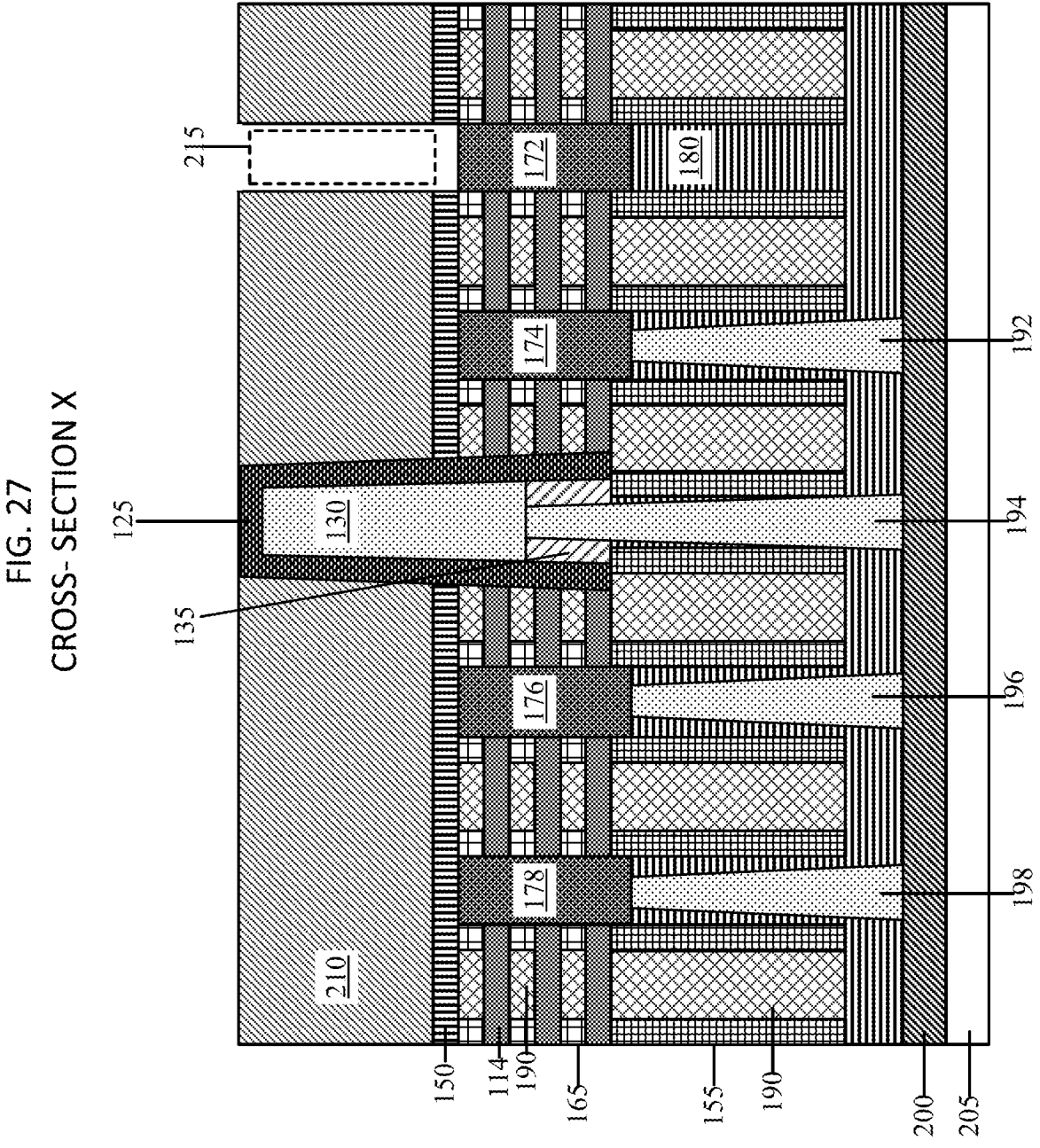
FIG. 27 illustrates a cross section X of the nano stack after formation of a backside interlayer dielectric layer and the removal of the backside placeholder, in accordance with the embodiment of the present invention.
Figure 28:
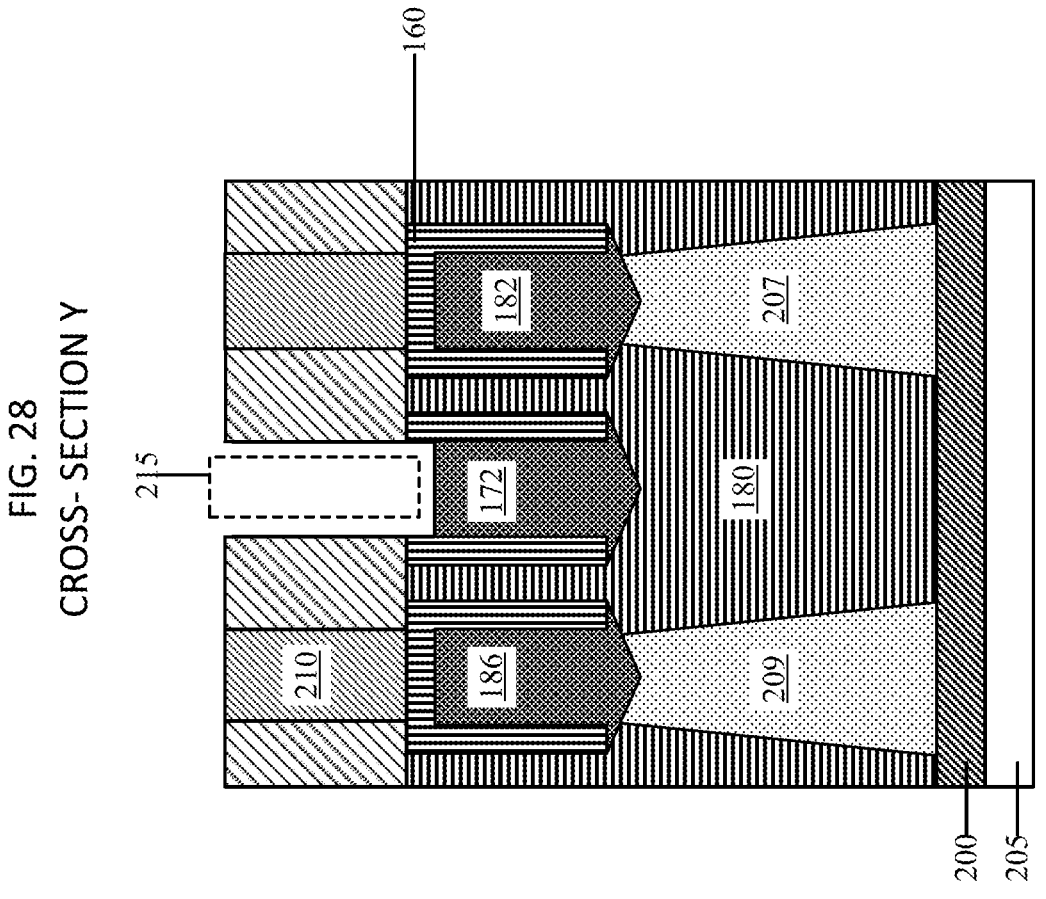
FIG. 28 illustrates a cross section Y of the source/drain region after formation of a backside interlayer dielectric layer and the removal of the backside placeholder, in accordance with the embodiment of the present invention.

FIGS. 27 and 28 illustrate the processing stage after formation of a backside interlayer dielectric layer 210 and the removal of the backside placeholder 170. A backside interlayer dielectric layer 210 is formed around the dielectric liner 125 and the backside placeholder 170. The backside placeholder 170 is removed to form a backside cavity 215. The backside cavity 215 exposes the backside surface of source/drain 172.

Figure 29:
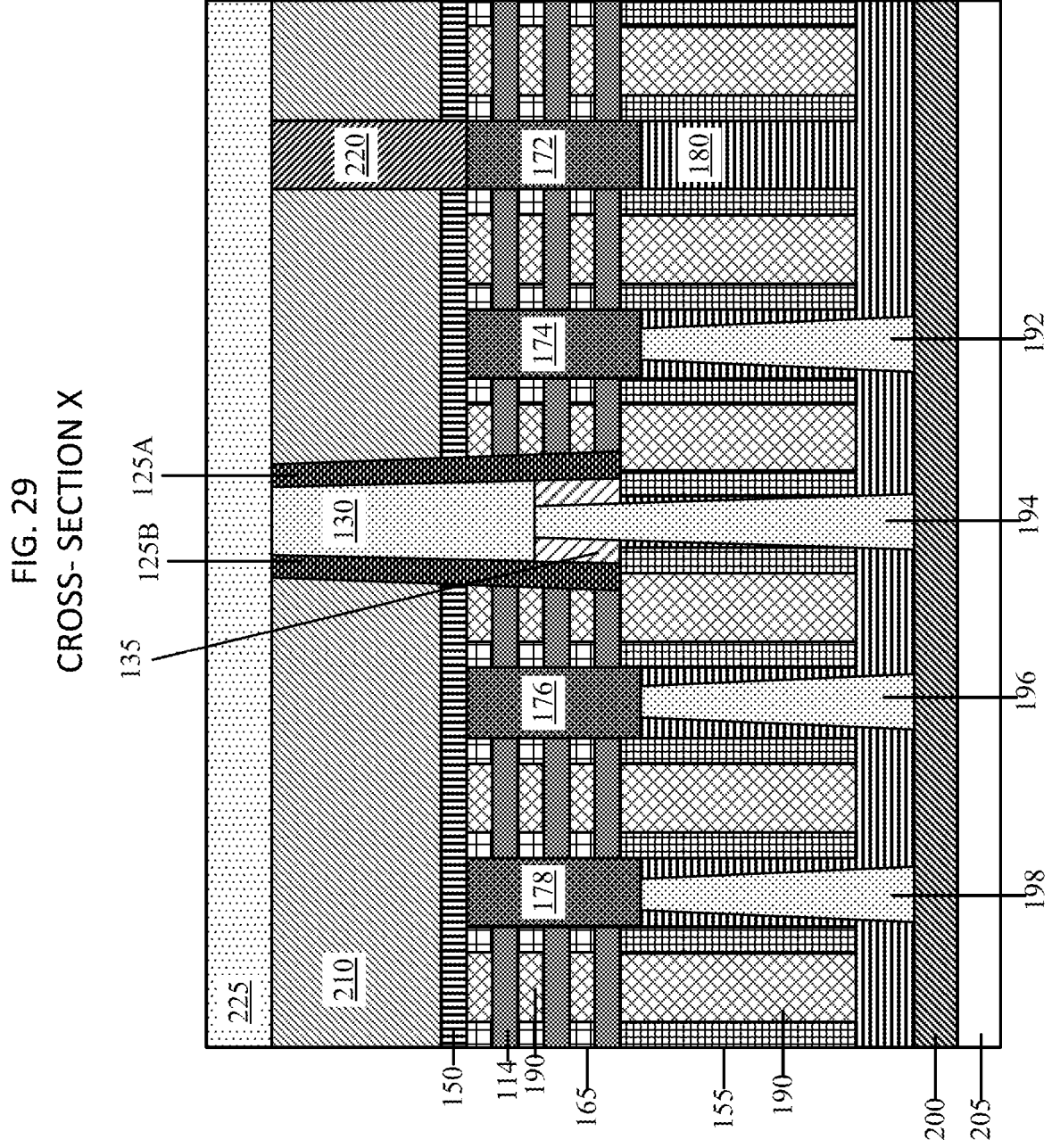
FIG. 29 illustrates a cross section X of the nano stack after formation of a backside contact and a backside interconnect, in accordance with the embodiment of the present invention.
Figure 30:
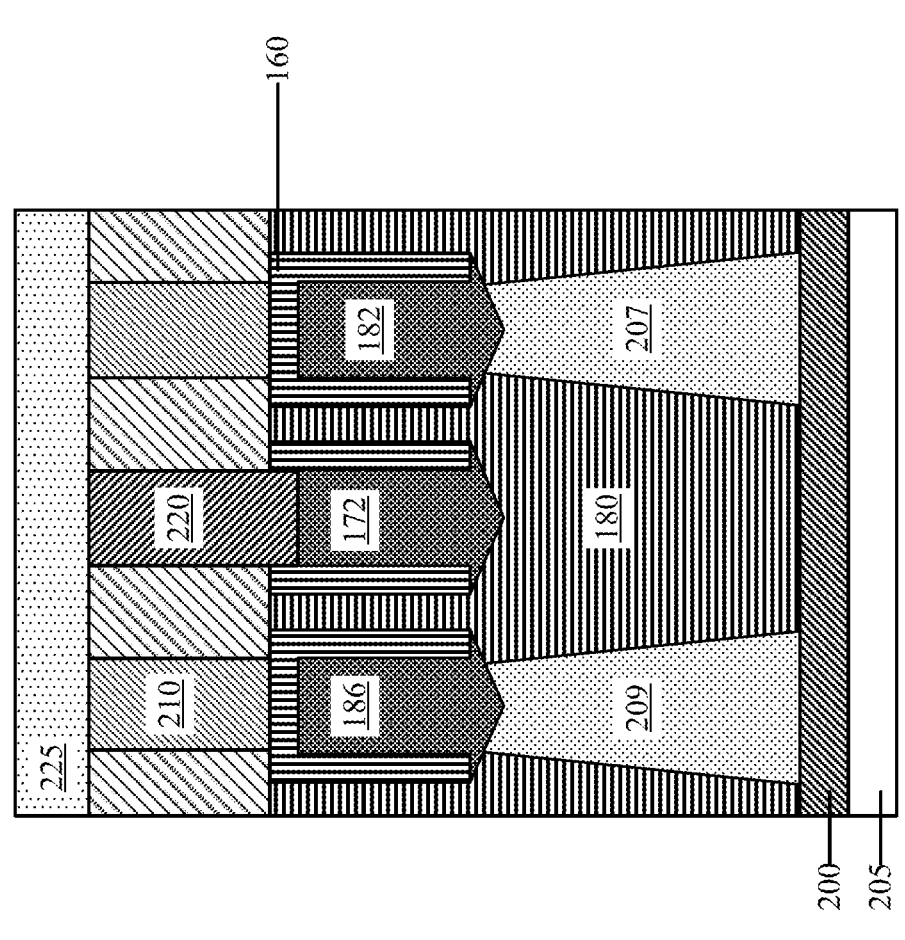
FIG. 30 illustrates a cross section Y of the source/drain region after formation of a backside contact and a backside interconnect, in accordance with the embodiment of the present invention.

FIGS. 29 and 30 illustrate the processing stage after formation of a backside contact 220 and a backside interconnect 225. The backside cavity 215 is filled in with a conductive metal to form the backside contact 220. The backside interlayer dielectric layer 210, the backside contact 220, and the dielectric liner 125 are polished by CMP to expose the backside surface of the metal fill layer 130. The CMP of the dielectric liner 125 separates the single dielectric liner 125 in to at least two dielectric liner segments 125A, 125B. The backside interconnected 225 is formed on the backside surface of the backside interlayer dielectric layer 210, the backside contact 220, the dielectric liner 125, and the metal fill layer 130. A direct connection is formed between the backside interconnect 225 and the BEOL layer 200. This connection is formed by interconnect contact 194 and the metal fill layer 130 located within the double diffusion break.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
    a first nano device that includes a plurality of first transistors;
    a second nano device that includes a plurality of second transistors, wherein the first nano device and the second nano device are parallel to each other;
    a double diffusion break that extends across the first nano device and the second nano device;
    a back-end-of-the-line (BEOL) layer located on a frontside of the first nano device and the second nano device; and
    a backside interconnect located on a backside of the first nano device and the second nano device, wherein the BEOL layer is connected to the backside interconnect through the double diffusion break.

2. The microelectronic structure of claim 1, wherein the double diffusion break includes at least two dielectric liner segments.

3. The microelectronic structure of claim 2, wherein the double diffusion break further includes a metal fill layer and a dielectric cap layer.

4. The microelectronic structure of claim 3, wherein the metal fill layer extends from a backside of the double diffusion break towards a frontside of the double diffusion break, wherein the dielectric cap layer is located on a frontside of the metal fill layer and located between the two dielectric liner segments.

5. The microelectronic structure of the claim 4, wherein the metal fill layer is connected to the backside interconnect.

6. The microelectronic structure of claim 5, further comprising:
    an interconnect contact that extends from the BEOL layer through the dielectric cap layer to connect to the metal fill layer.

7. A microelectronic structure comprising:
    a first nano device that includes a plurality of first transistors;
    a second nano device that includes a plurality of second transistors, wherein the first nano device and the second nano device are parallel to each other;
    a double diffusion break that extends across the first nano device and the second nano device, wherein the first nano device includes a first dummy device, and wherein the second nano device includes a second dummy device;
    a back-end-of-the-line (BEOL) layer located on a frontside of the first nano device and the second nano device; and
    a backside interconnect located on a backside of the first nano device and the second nano device, wherein the BEOL layer is connected to the backside interconnect through the double diffusion break.

8. The microelectronic structure of claim 7, wherein the double diffusion break includes a first dielectric liner segment and a second dielectric liner segment.

9. The microelectronic structure of claim 8, wherein the first dummy device and the second dummy device are flush against the first dielectric liner segment.

10. The microelectronic structure of claim 9, wherein the first nano device further comprises a third dummy device, and the second nano device further comprises a fourth dummy device.

11. The microelectron structure of claim 10, wherein the third dummy device and the fourth dummy device are flush against the second dielectric liner segment.

12. The microelectronic structure of claim 11, wherein the double diffusion break further includes a metal fill layer and a dielectric cap layer.

13. The microelectronic structure of claim 12, wherein the metal fill layer and the dielectric cap layer are located between the first dielectric liner segment and the second dielectric liner segment.

14. The microelectronic structure of claim 13, wherein the metal fill layer extends from a backside of the double diffusion break towards a frontside of the double diffusion break, wherein the dielectric cap layer is located on a frontside of the metal fill layer and located between the first and the second dielectric liner segments.

15. The microelectronic structure of the claim 14, wherein the metal fill layer is connected to the backside interconnect.

16. The microelectronic structure of claim 15, further comprising:

an interconnect contact that extends from the BEOL layer through the dielectric cap layer to connect to the metal fill layer.

17. A microelectronic structure comprising:

a first nano device that includes a plurality of first transistors;

a second nano device that includes a plurality of second transistors, wherein the first nano device and the second nano device are parallel to each other;

a double diffusion break that extends across the first nano device and the second nano device;

a back-end-of-the-line (BEOL) layer located on a frontside of the first nano device and the second nano device;

a backside interconnect located on a backside of the first nano device and the second nano device; and an interconnect contact that extends from the BEOL layer to the double diffusion break, wherein the interconnect contact extends from the first nano device to the second nano device, wherein the BEOL layer is connected to the backside interconnect through the double diffusion break.

18. The microelectronic structure of claim 17, wherein the double diffusion break includes at least two dielectric liner segments.

19. The microelectronic structure of claim 18, wherein the double diffusion break further includes a metal fill layer and a dielectric cap layer.

20. The microelectronic structure of claim 19, wherein the metal fill layer extends from a backside of the double diffusion break towards a frontside of the double diffusion break, wherein the dielectric cap layer is located on a frontside of the metal fill layer and located between the two dielectric liner segments.

\* \* \* \* \*